(12) United States Patent  (10) Patent No.: US 9,418,197 B1
Farbiz et al.  (45) Date of Patent: Aug. 16, 2016

(54) METHOD FOR DESIGNING DIODES

(71) Applicant: Texas Instruments Incorporated, Dallas, TX (US)

(72) Inventors: Farzan Farbiz, Dallas, TX (US); Aravind C. Appaswamy, Dallas, TX (US); Akram A. Salman, Plano, TX (US); Gianluca Boselli, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/612,071

(22) Filed: Feb. 2, 2015

(51) Int. Cl.
 *G06F 9/455* (2006.01)
 *G06F 17/50* (2006.01)

(52) U.S. Cl.
 CPC .................................. *G06F 17/5081* (2013.01)

(58) Field of Classification Search
 USPC .................................................. 716/112, 101
 See application file for complete search history.

(56) References Cited

U.S. PATENT DOCUMENTS

2009/0280582 A1* 11/2009 Thijs .................... H01L 27/0248
 438/14
2013/0057991 A1* 3/2013 Chatty ................ H01L 29/7436
 361/56

\* cited by examiner

*Primary Examiner* — Brian Ngo
(74) *Attorney, Agent, or Firm* — Daniel Chan; Frank D. Cimino

(57) ABSTRACT

A method of designing a diode includes generating a layout of the diode and calculating a calculated voltage overshoot based on the layout. The calculating includes calculating variables of: the length of an N region of the diode; current density during an ESD event; electron charge; hole mobility; electron mobility; doping concentration of the diode; and rise time of the ESD event.

7 Claims, 5 Drawing Sheets

METHOD FOR DESIGNING DIODES

BACKGROUND

High-speed interface integrated circuits (ICs), such as HDMI (High Definition Multimedia Interface) and USB-3, require high levels of electrostatic discharge (ESD) protection to interface safely with cables and connectors. Diode-based ESD protection devices, such as dual-diode protection circuits or diode-isolated snapback devices are the only ESD solutions that can be optimized on an IC in the sub-1 pF range to meet many of the speed and ESD requirements of the interface ICs.

There are advantages to using diodes with lightly doped regions for ESD protection. However, these diodes are often associated with high voltage overshoots during fast transient events resulting from ESD events. The high voltage overshoots are primarily due to the time it takes carriers to establish conductivity modulation. It is known that the voltage overshoot of the ESD protection devices can damage the gate oxides of protected MOS transistors; however, these devices had not suffered failures of the forward-biased ESD diodes due to the voltage overshoot until recently. These failures are caused by current filamentation in the diodes due to the voltage overshoots.

The voltage overshoots are dependent on the voltage drop across the diodes during ESD events. Therefore, the diodes must have low voltage drops during ESD events and have low parasitic capacitance. The development cycle for designing such diodes for high-speed ESD protections is often expensive because these parameters cannot be modeled, so the design involves multiple steps of IC fabrication. More specifically, the diodes are fabricated in silicon or another semiconductor material and their parameters are measured after fabrication, which is time consuming and expensive. If the diode parameters show a high voltage overshoot or a high capacitance, the diode parameters are changed and a new diode is fabricated and measured. The process continues until a satisfactory diode is achieved.

SUMMARY

A method of designing a diode includes generating a layout of the diode and calculating a calculated voltage overshoot based on the layout. The calculating includes calculating variables of: the length of an N region of the diode; current density during an ESD event; electron charge; hole mobility; electron mobility; doping concentration of the diode; and rise time of the ESD event.

DETAILED DESCRIPTION

Figure 1:
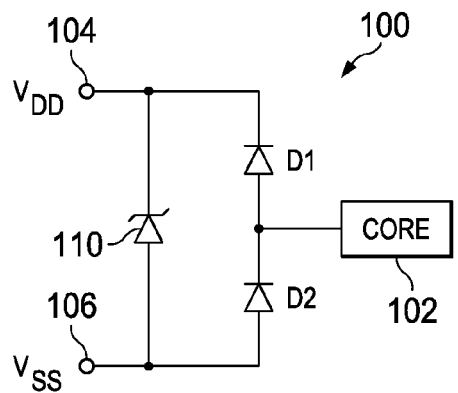
FIG. 1 is a schematic diagram of an example of a diode-based electrostatic discharge (ESD) protection circuit.

FIG. 1 is an example of a diode-based electrostatic discharge (ESD) protection circuit 100 that protects a core circuit 102 from ESD events. In some examples, the core circuit 102 is an input/output device that operates at high speeds. Examples of input/output devices include high-speed interface integrated circuits (ICs), such as high definition multimedia interface (HDMI) and USB-3, which require high levels of ESD protection to interface safely with cables and connectors. In addition to requiring ESD protection, these circuits require low capacitance to facilitate their high speed operation. The circuit 100 includes a first node 104 and a second node 106. The first node is connectable to a first power source, such as VDD and the second node is connectable to a second power source, such as VSS, or a ground potential. A clamp 110 is coupled between the first node 104 and the second node 106 to clamp the voltage difference between the nodes 104, 106. In the example of FIG. 1, the clamp 110 is a zener diode.

The circuit 102 includes two diodes D1 and D2 that provide ESD protection. The diode D1 provides a discharge path during positive ESD events from the core circuit 102 to the first node 104, which is coupled to VDD. The diode D2 provides a discharge path during negative ESD events from the core circuit 102 to the second node 106, which is coupled to VSS. Presently, dual-diode protection, such as described in the circuit 100, or diode-isolated snapback devices (not shown) are the only on-chip ESD protection devices that can be optimized in the sub-1 pF range to meet speed, ESD, and low capacitance requirements of some high speed applications.

As described further below, some examples of the diodes D1 and D2 have lightly doped regions, which offer some advantages for ESD protection. However, these diodes with lightly doped regions often have high voltage overshoots during fast transient events, such as ESD events. The high voltage overshoots are primarily due to the time it takes carriers to establish conductivity modulation. The voltage overshoots of the diodes D1 and D2 can damage the gate oxides of protected MOS transistors in the circuit core 102. Prior to high speed operations, the ESD protection diodes had not suffered forward-bias failures due to the voltage overshoot. With the advent of high speed applications, rise-time dependent failures in ESD diodes operating in forward-biased mode have been occurring. The physical cause of these failures is typically current filamentation in the diodes due to the voltage overshoots.

The voltage overshoots are dependent on the voltage drop across the diodes D1 and D2 during ESD events. Therefore, the diodes D1 and D2 must have low voltage drops during ESD events and have low parasitic capacitance in order to reduce or eliminate the voltage overshoots. The conventional development cycle for designing such diodes for high-speed ESD protection is often expensive because the parameters related to voltage overshoot cannot be modeled, so the design involves multiple iterations of fabrication of the diodes. More specifically, the diodes are fabricated in a semiconductor, such as silicon, and their parameters are measured after fabrication, which is time consuming and expensive. If the parameters are not within predetermined values, the design of the diode is changed and it is fabricated and tested again. The fabrication and testing process continues until a diode having parameters within the predetermined values are fabricated. The design methods described herein overcome the problems with conventional designs by calculating the voltage overshoot based on the physical characteristics of diode parameters rather than fabricating diodes and measuring the voltage overshoot of the fabricated diodes.

Figure 2A:
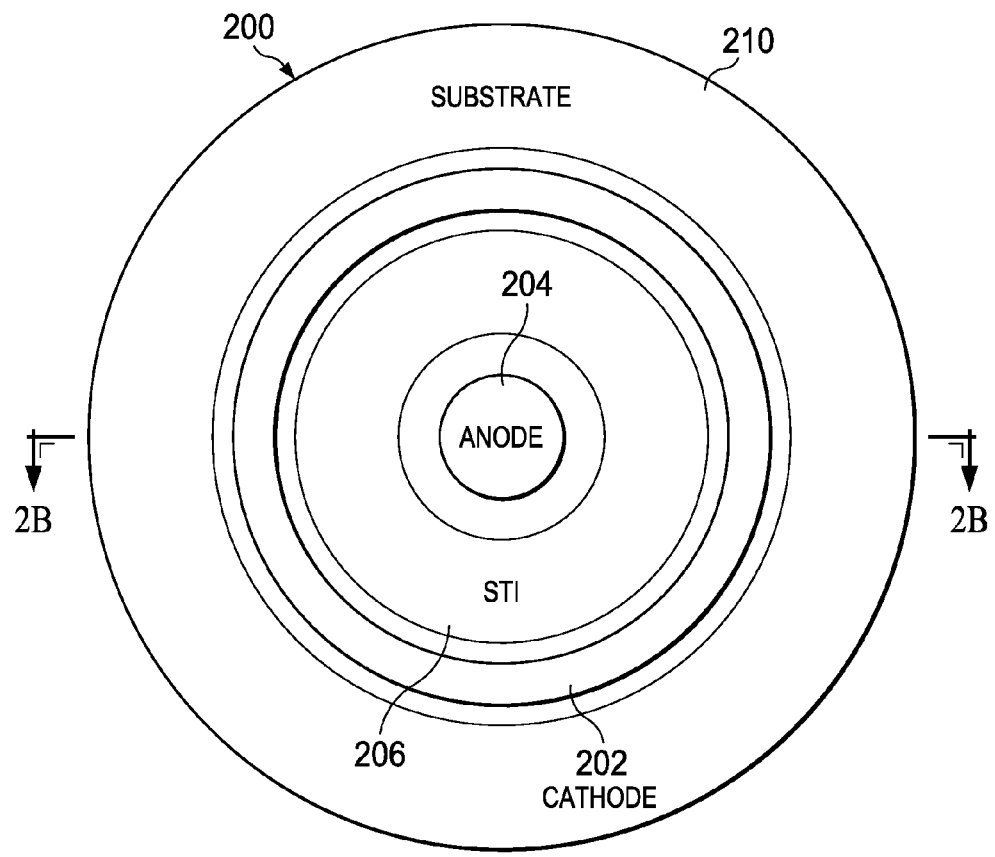
FIG. 2A is a plan view of an example of a diode in the ESD protection circuit of FIG. 1.
Figure 2B:
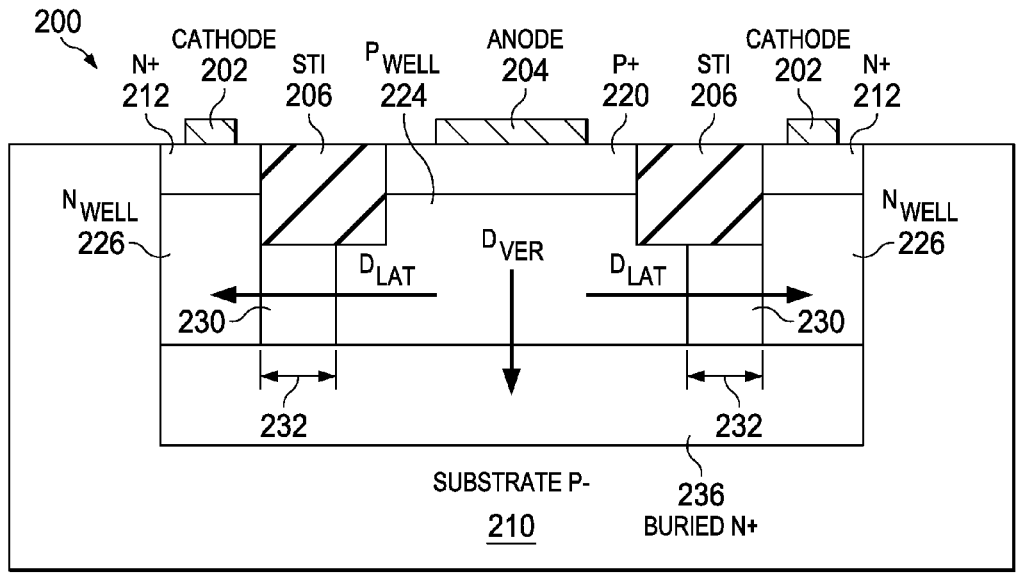
FIG. 2B is a cutaway view of an example of the diode of FIG. 2A.

FIG. 2A is an example of a plan view of a diode 200 that is representative of one or both of the diodes D1, D2 of FIG. 1 and FIG. 2B is an example of a cutaway view of the diode 200. Neither view of the diode 200 is necessarily drawn to scale. As shown in FIG. 2A, the diode 200 has concentric regions. A region close to the outside portion of the diode 200 is the cathode 202 and the inner region is the anode 204. The cathode 202 and anode 204 are separated by a shallow trench isolation (STI) 206. The diode 200 is fabricated in a substrate 210.

As shown in FIG. 2B, the anode 204 is a P+ region 220 and the cathode 202 is an N+ region. The P+ region 220 is located above a Pwell 224 and the N+ region is located above an Nwell 226. The Pwell 224 and the Nwell 226 are separated by an epitaxial layer (EPI) 230 to eliminate a Pwell/Nwell junction capacitance. In the example of FIG. 2B, the EPI 230 has a width 232 and is doped P−. The Pwell 224, Nwell 226, and EPI 230 are adjacent a buried N+ region 236. All of the regions are located within the substrate 210. The diode 200 has a lateral Pwell/P−/Nwell junction that is referred to as the lateral junction $D_{LAT}$. In addition, the diode 200 has a vertical Pwell/Buried-N junction that is referred to as the vertical junction $D_{VER}$. In very large scale integration (VLSI) fabrication technology, particularly for high speed diodes, the process of making one diode results in a structure that inherently has more than one type of PN structure or junction. The example of FIG. 2B includes two diodes or junctions, one lateral ($D_{LAT}$) and one vertical ($D_{VER}$) that are described as being in parallel with each other. There may be diodes where the fabricated diode has several PN junctions with different junction profiles, capacitances, and voltage overshoots.

Some conventional diodes fail unexpectedly when subjected to voltages that they should withstand. Many of these failures occur in the lightly doped EPI 230 beneath the STI region 206. The cause of the failure tends to be a short in this region between the anode 204 and the cathode 202, which is sometimes referred to as filamentation. In some examples, diodes were subjected to transmission line pulse (TLP) testing where it was found that the shorter the rise time of the TLP resulted in lower the failure rates.

When the diode 200 is subjected to a transient current ramp, the diode current is carried by the lateral junction $D_{LAT}$ and the vertical junction $D_{VER}$. It is to be noted that the junction $D_{LAT}$ has a shorter base width than the lateral junction $D_{VER}$. Current density profiles at different rise-times show that the current conduction becomes non-uniform at fast rise-times with most of the current carried laterally by the lateral junction $D_{LAT}$. The current flow is equally divided between the two junctions $D_{LAT}$ and $D_{VER}$ when the rise time is long. The current flow is mostly through the lateral junction $D_{LAT}$ when the rise time is short. The low failure rate in short rise times is attributed to the current localization caused by unequal voltage overshoots of the junctions $D_{LAT}$ and $D_{VER}$.

The voltage-overshoot of the diode 200 is a function of base width and junction types, which are different for the lateral and vertical junctions $D_{LAT}$ and $D_{VER}$ in the diode 200. It has been found that the lateral junction $D_{LAT}$ has a significantly smaller voltage overshoot than the vertical junction $D_{VER}$ at small rise times due to a smaller diffusion length. Therefore, the lateral junction $D_{LAT}$ clamps the voltage and conducts most of the current before the vertical junction $D_{VER}$ fully turns on, which yields the above-described non-uniform conduction between the lateral and vertical junctions $D_{LAT}$ and $D_{VER}$. The reason that current conduction is relatively uniform for longer rise times is because of insignificant voltage overshoots at the lateral and vertical junctions $D_{LAT}$ and $D_{VER}$. It has also been found that the localized lateral current flow through the lateral junction $D_{LAT}$ at fast rise times elevates the temperature under the STI 206 and causes a thermal failure. The voltage overshoot of the lateral and vertical junctions $D_{LAT}$ and $D_{VER}$ cannot be independently measured or simulated because as these junctions/diodes exist inherently in the structure of the diode 200.

Figure 3:
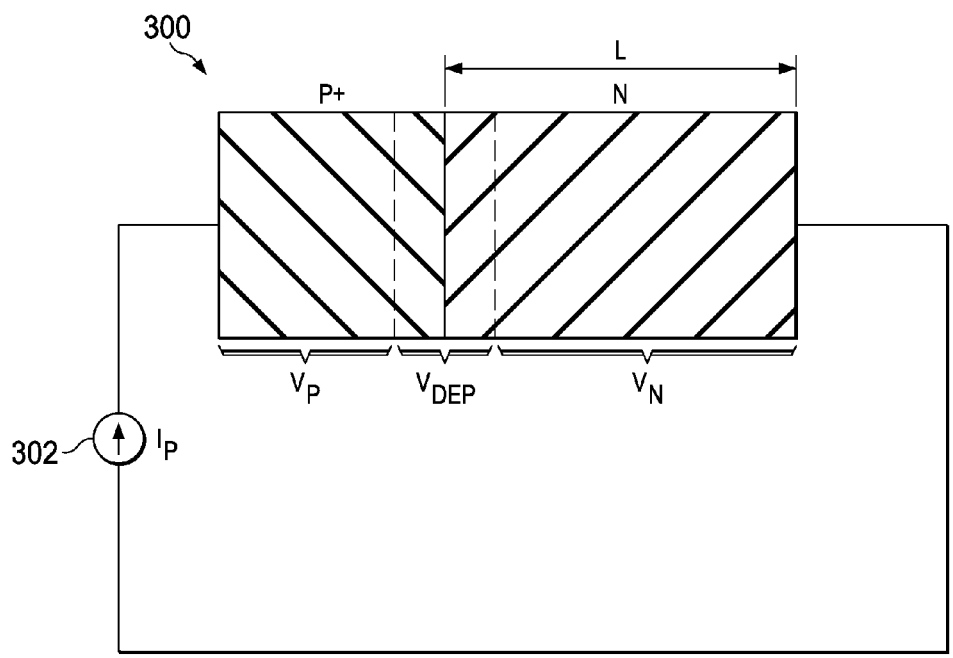
FIG. 3 is a simplified view of a diode 300 for describing the physics of voltage overshoot in forward biased diodes.

FIG. 3 is a simplified view of a diode 300 that is used to describe the physics of voltage overshoot in forward biased diodes. The diode 300 is a simplified P+/N diode that is connected to a current source 302, which generates a current pulse $I_P$. The diode 300 has a P+ region noted by negative sloped hatching and an N region noted by positive sloped hatching. The N region is doped to a distance L. A depletion region extends in the N region and the region between the dashed lines. In response to a pulse generated by the current source 302, the P+ region generates a voltage $V_P$, the depletion region generates a voltage $V_{DEP}$, and the N region generates a voltage $V_N$.

Figure 4A:
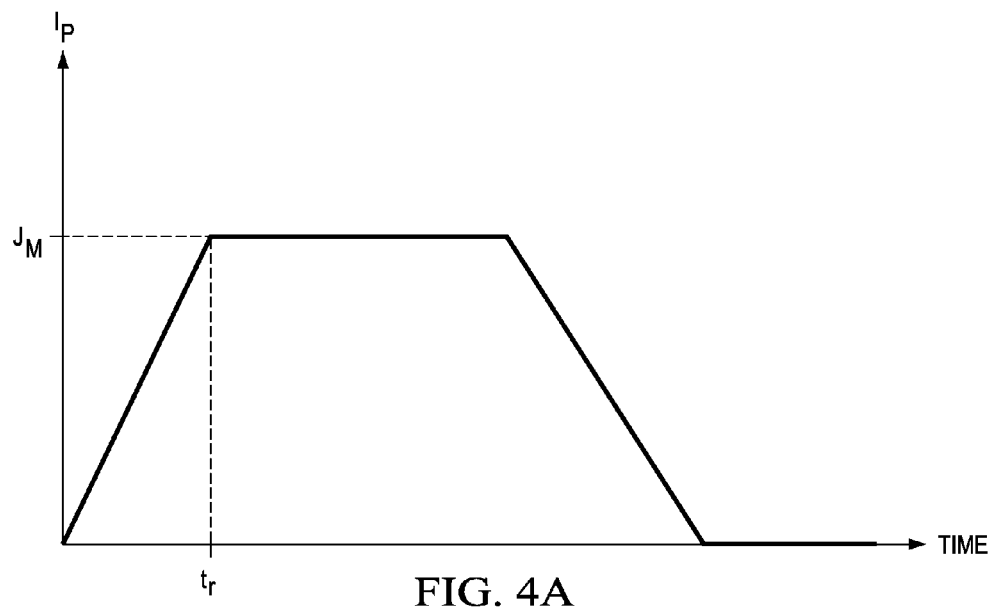
FIG. 4A is a graph of an example of a current pulse generated by the current source of FIG. 3.
Figure 4B:
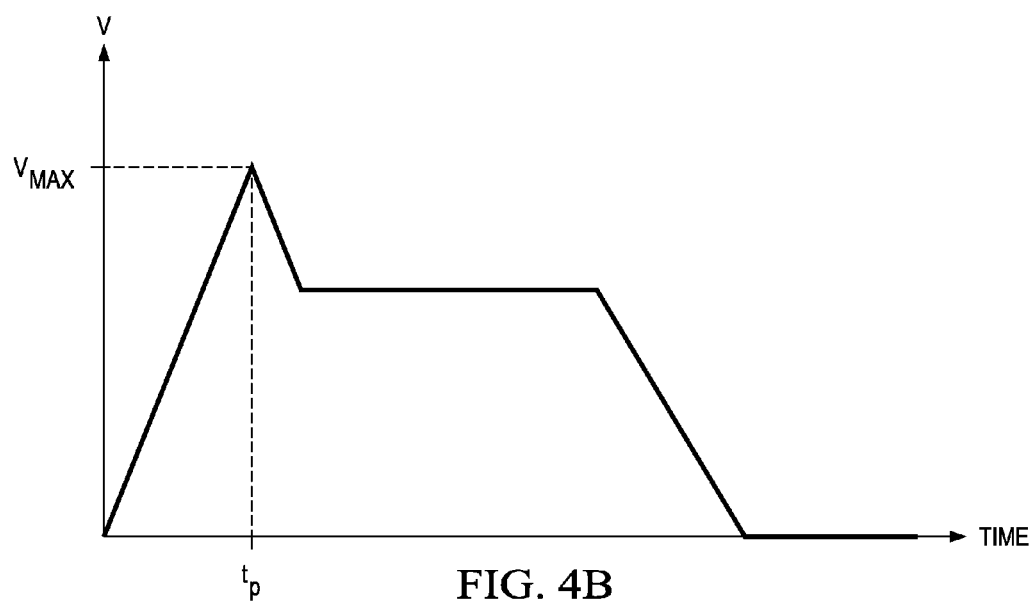
FIG. 4B is a graph of an example of the voltage across the diode of FIG. 3 in response to the current pulse of FIG. 4A.

The current source 302 generates a current pulse $I_P$ as shown by the graph of FIG. 4A, having a rise time of $t_r$ and amplitude of $J_m$. The resulting voltage across the diode 300 is shown by the graph of FIG. 4B. As shown, the voltage across the diode 300 increases to a maximum voltage $V_{MAX}$, with a rise time of $t_P$, before dropping to a steady state value as shown in FIG. 4B. The voltage profile along the diode 300 has found that the voltage drop $V_N$ across the N region is much greater than the voltage drop $V_P$ across the P+ region and the voltage drop $V_{DEP}$ across the depletion region because of the light background doping in the N region described relative to FIG. 2B.

The conductivity σ of the N region is given by equation (1) as follows:

$$\sigma = q n_n \mu_e \qquad \text{Equation (1)}$$

where $\mu_e$ and $n_n$ are the electron mobility and doping density in the N region, respectively. The value $n_n$ is equal to the background doping density, which is referred to as Nd, under low-level injection conditions. As the current increases, the electron and hole densities in the N region increase and may exceed the background doping density Nd. This typically occurs in low-capacitance diodes during ESD events because of the low background doping density Nd and high current levels. When $n_n$ is greater than background doping density Nd, the conductivity σ of the N region increases according to equation (I) and causes the voltage $V_N$ across the N region to fall. Under these conditions, the diode resistivity becomes a function of time.

In order for an analytical model of voltage overshoot to be accurate, it must take into account high current levels and fast rise times present during ESD events. In addition, the model must take into account the effects of diode geometry and background doping. The maximum voltage overshoot $V_{MAX}$ is defined as the maximum voltage drop across the diode 200 at the time $t_P$ in response to the current $I_P$ having a rise time tr. The maximum voltage overshoot $V_{MAX}$ is defined by equation (2) as follows:

$$V_{MAX} = \frac{L^{1.5}}{2}\sqrt{\frac{J_m}{c_1 q \mu_n \mu_h N_d t_r}}$$ Equation 2 where:
L is the length of the N+ region;
Jm is the current density during an ESD event;
$C_1$ is a fitting factor that is greater than zero and less than or equal to one;
q is electron charge;
$\mu_h$ is the hole mobility;
$\mu_e$ is the electron mobility;
Nd is the doping concentration of the diode 200; and
tr is the rise time of an ESD event.

The fitting factor $C_1$ is an empirical parameter that is not based on the physical properties of the diode. Rather, the fitting factor $C_1$ is merely a correction factor so that the math works in practice. It is often needed to account for the approximations in the analytical derivation of the maximum voltage overshoot $V_{MAX}$.

During the design of integrated circuits, the maximum voltage overshoot $V_{MAX}$ is calculated using equation (3) rather than fabricating diodes and measuring the voltage overshoot or measuring other parameters of the diode that determine the voltage overshoot. The process of calculating the maximum voltage overshoot $V_{MAX}$ based on the diode parameters is more cost effective and faster than the conventional methods of fabricating a diode and then measuring the voltage overshoot. More specifically, no unnecessary diode fabrication is required when the maximum voltage overshoot $V_{MAX}$ is calculated.

Figure 5:
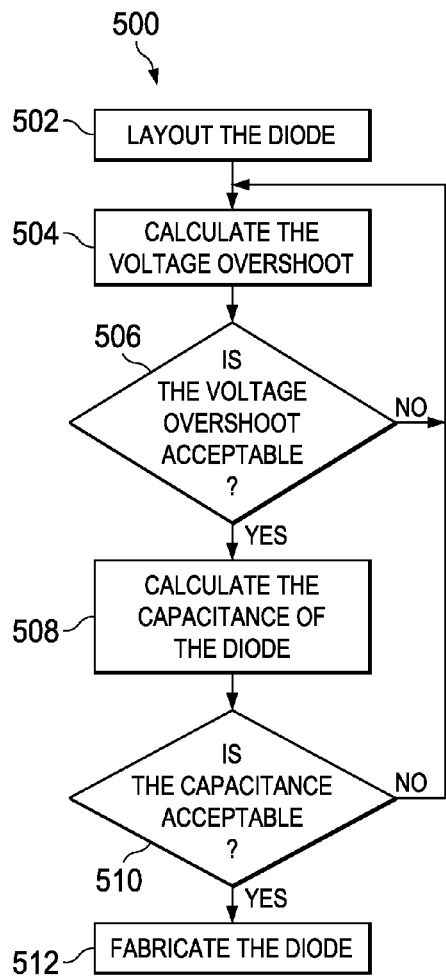
FIG. 5 is a flowchart of an example of a method of fabricating the diode of FIGS. 2A and 2B.

FIG. 5 is a flow chart 500 describing a method of fabricating the diode 200 of FIGS. 2A and 2B. The method commences at step 502 with laying out the diode. This process may involve choosing the physical parameters set forth above in equation (2). The maximum voltage overshoot $V_{MAX}$ is then calculated in step 504 and may be calculated for a range of ESD events. For example, the rise time of the ESD event and the current density through the diode resulting from the ESD events are parameters that are included in the calculation, which yields a calculated maximum voltage overshoot $V_{MAX}$. At decision block 506 a determination is made as to whether the calculated maximum voltage overshoot $V_{MAX}$ is acceptable. The determination may be accomplished by comparing the maximum voltage overshoot $V_{MAX}$ to a predetermined value, which is the maximum acceptable voltage overshoot $V_{MAX}$. As described above, the voltage overshoot $V_{MAX}$ may weaken or cause the diode to fail, so the maximum voltage overshoot $V_{MAX}$ is calculated based on the physical characteristics of the diode to make sure the maximum voltage overshoot $V_{MAX}$ does not damage the diode. It is noted that the maximum voltage overshoot $V_{MAX}$ is shown in FIG. 4B.

In step 508, the capacitance of the diode is calculated. For example, based on the parameters of the diode layout, the capacitance of the diode is calculated. As described above, most diodes used in ESD applications operating at high speeds require low capacitance. In decision block 510, a determination is made as to whether the capacitance of the diode is acceptable. As shown in FIG. 5, if either the calculated maximum voltage overshoot $V_{MAX}$ or the calculated capacitance is not within the predetermined values, the processing returns to step 502 to change the layout of the diode. The process may continue until both the capacitance and maximum voltage overshoot $V_{MAX}$ are within predetermined values. It is noted that in some examples, the capacitance is calculated before the maximum voltage overshoot $V_{MAX}$ is calculated. In some examples, the capacitance is not calculated. If both the maximum voltage overshoot $V_{MAX}$ and the capacitance are within the predetermined values, the diode is fabricated, such as by conventional processes in a silicon material as shown in step 512. Although the process of the flow chart 500 is iterative, no iterative fabrication is required as is required in conventional diode fabrication.

Figure 6:
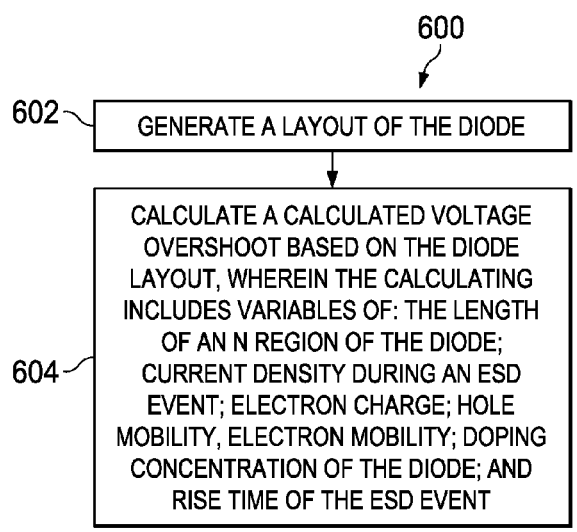
FIG. 6 is a flowchart of another example of a method of fabricating the diode of FIGS. 2A and 2B.

FIG. 6 is a flowchart 600 describing another example of a method of fabricating the diode of FIGS. 2A and 2B. In step 602, a layout of the diode is generated. In step 604 the calculated voltage overshoot is calculating based on the layout of the diode, wherein the calculating includes calculating variables of: the length of an N region of the diode; current density during an ESD event; electron charge; hole mobility; electron mobility; doping concentration of the diode; and rise time of the ESD event.

Another advantage of using the model for calculating the voltage overshoot is that the PN junctions in the diode may have very different voltage overshoots. The result of several voltage overshoots is that the diode may have very weak ESD performance and will likely fail prematurely. Therefore, at the design phase, the different PN junctions can be modeled to compare the voltage overshoots of the various PN junctions that exist in the diode and ensure that their voltage overshoots are compatible with the overall voltage overshoot requirements.

Figure 7:
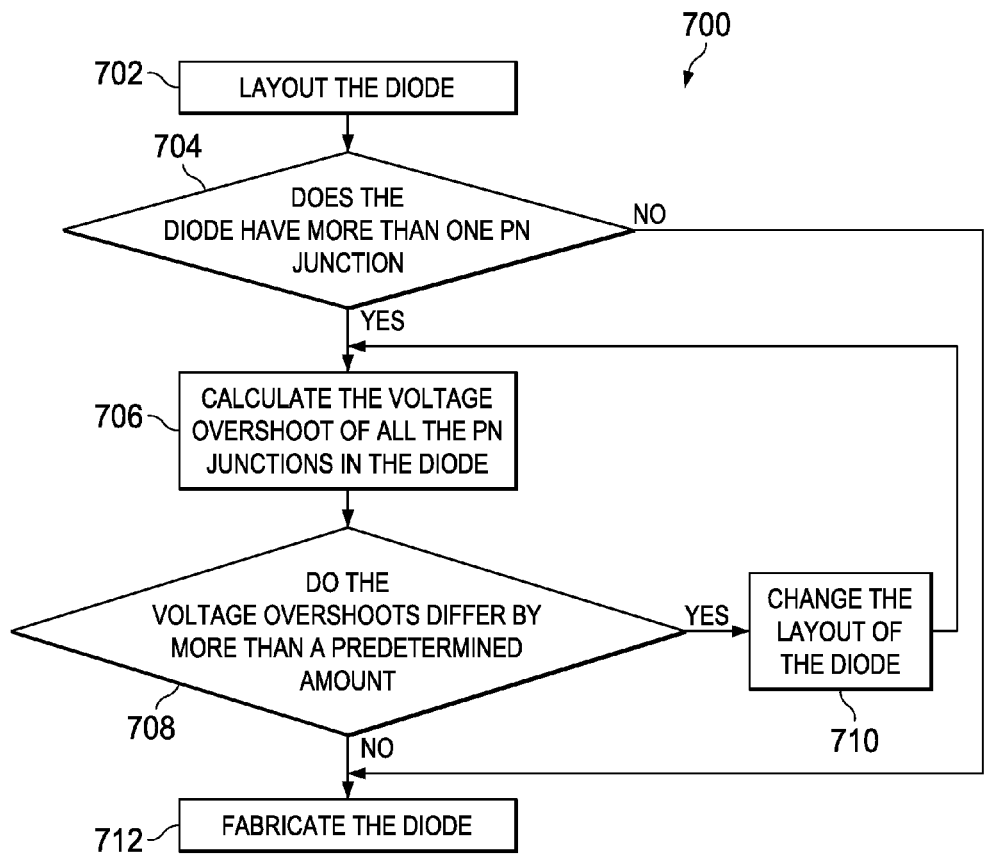
FIG. 7 is a flowchart of an example of a method of fabricating a diode that has several PN junctions.

FIG. 7 is a flowchart 700 that describes an example of a method of fabricating a diode with several PN junctions. The flowchart commences at step 702 with laying out the diode. In step 704, a determination is made as to whether there are more than one PN junctions. If so, processing proceeds to step 706 where the voltage overshoots of all the PN junctions are calculated. In step 708, a decision is made as to whether the voltage overshoots of the PN junctions differ by more than a predetermined value. If so, processing proceeds to step 710 where the layout of the diode is changed followed by a return to step 706 where the voltage overshoots of the PN junctions of the new layout are calculated. If there is only one PN junction in step 704 or of the difference between voltage overshoots in step 708 is less than the predetermined value, processing proceeds to step 712 where the diode is fabricated. The resulting diode does not have any PN junctions that have voltage overshoots that exceed the voltage overshoots of other PN junctions by a value greater than the predetermined value. Accordingly, the diode is less likely to fail due to the voltage overshoots. In some examples, the method described by the flowchart 700 is expanded to include calculating the capacitance and generating a new diode layout if the capacitance exceeds a predetermined value.

The methods described herein may be performed on a computer. For example, a computer program that performs the layout of the diode 200 may use the parameters of the diode 200 to calculate the voltage overshoot and capacitance. These values may then be compared to predetermined values to determine if the diode is acceptable. In other embodiments, a user or other computer program may input some or all of the values in equation (2) to a computer or computer program that calculates the voltage overshoot as set forth herein.

While an illustrative and presently preferred embodiment of the disclosure have been described in detail herein, it is to be understood that the inventive concepts may be otherwise variously embodied and employed and that the appended claims are intended to be construed to include such variations except insofar as limited by the prior art.

What is claimed is:

1. A method of designing a circuit for suppressing electrostatic discharge, the method comprising:
   generating a first layout including a first diode;
   calculating a first calculated voltage overshoot of the first diode based on the first layout and first variables of: a length of an N region of the first diode; current density during an ESD event; electron charge; hole mobility; electron mobility; a doping concentration of the first diode; and a rise time of the ESD event;
   generating a second layout including a second diode;
   calculating a second calculated voltage overshoot of the second diode based on the second layout and second variables of: a length of an N region of the second diode; the current density during the ESD event; the electron charge;
   the hole mobility; the electron mobility; a doping concentration of the second diode; and the rise time of the ESD event, wherein an anode of the first diode is coupled to a cathode of the second diode; and
   determining whether the first and second calculated voltage overshoots meet a predetermined threshold.

2. The method of claim 1, further comprising:
   generating a third layout including the first diode in response to the first calculated voltage overshoot failing the predetermined threshold; and
   calculating a third calculated voltage overshoot of the first diode based on the third layout and the first variables.

3. The method of claim 1, further comprising:
   repeatedly modifying the first layout including the first diode until the first calculated voltage overshoot of the first diode meets the predetermined threshold.

4. The method of claim 1, further comprising:
   generating a third layout including the second diode in response to the second calculated voltage overshoot failing the predetermined threshold; and
   calculating a third calculated voltage overshoot of the second diode based on the third layout and the second variables.

5. The method of claim 1, further comprising:
   repeatedly modifying the second layout including the second diode until the second calculated voltage overshoot of the second diode meets the predetermined threshold.

6. The method of claim 1, further comprising:
   calculating a calculated capacitance of the first diode; and
   generating a third layout including the first diode in response to the calculated capacitance being outside a predetermined value.

7. The method of claim 1, further comprising:
   calculating a calculated capacitance of the second diode; and
   generating a third layout including the second diode in response to the calculated capacitance being outside a predetermined value.

* * * * *